(12) United States Patent
Kobayashi

(10) Patent No.: US 12,407,947 B2
(45) Date of Patent: Sep. 2, 2025

(54) PHOTOELECTRIC CONVERSION APPARATUS AND EQUIPMENT

(71) Applicant: CANON KABUSHIKI KAISHA, Tokyo (JP)

(72) Inventor: Hideo Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 451 days.

(21) Appl. No.: 17/963,289

(22) Filed: Oct. 11, 2022

(65) Prior Publication Data

US 2023/0171514 A1 Jun. 1, 2023

(30) Foreign Application Priority Data

Nov. 12, 2021 (JP) .................................. 2021-185152

(51) Int. Cl.
| | |
|---|---|
| *H04N 25/42* | (2023.01) |
| *H04N 25/709* | (2023.01) |
| *H04N 25/767* | (2023.01) |
| *H10F 39/00* | (2025.01) |

(52) U.S. Cl.
CPC ........... *H04N 25/42* (2023.01); *H04N 25/709* (2023.01); *H04N 25/767* (2023.01); *H10F 39/8037* (2025.01)

(58) Field of Classification Search
CPC ......... H01L 27/14627; H01L 27/14636; H01L 27/14634; H01L 27/14621; H04N 5/378; H04N 25/78; H04N 25/767; H04N 25/709; H04N 25/42; H10F 39/8037
See application file for complete search history.

(56) References Cited

U.S. PATENT DOCUMENTS

| | | | |
|---|---|---|---|
| 7,990,440 B2 | 8/2011 | Kobayashi et al. | |
| 8,710,558 B2 | 4/2014 | Inoue et al. | |
| 8,835,828 B2 | 9/2014 | Kobayashi | |
| 8,884,391 B2 | 11/2014 | Fudaba et al. | |

(Continued)

FOREIGN PATENT DOCUMENTS

| | | | |
|---|---|---|---|
| JP | 2018-139374 A | 9/2018 | |
| JP | 2019-126013 A | 7/2019 | |

(Continued)

OTHER PUBLICATIONS

Jul. 26, 2024 Official Action in Japanese Patent Appln. No. 2021-185152.

*Primary Examiner* — Xi Wang
(74) *Attorney, Agent, or Firm* — Venable LLP

(57) ABSTRACT

A photoelectric conversion apparatus included pixel circuits, signal lines, current sources, a switching circuit configured to switch a connection state among the plurality of signal lines and the plurality of current sources, and a control circuit configured to control the connection state of the switching circuit. The switching circuit can implement a first connection state in which a first signal line and a second signal line are insulated from each other, a first current source is electrically connected to the first signal line, and a second current source is electrically connected to the second signal line, and a second connection state in which at least the first current source is electrically connected to at least the second signal line. The control circuit selects the first and second connection states in first and second operation modes, respectively.

13 Claims, 13 Drawing Sheets

(56) References Cited

U.S. PATENT DOCUMENTS

| | | |
|---|---|---|
| 9,264,641 B2 | 2/2016 | Kobayashi |
| 9,305,954 B2 | 4/2016 | Kato et al. |
| 9,357,122 B2 | 5/2016 | Kususaki et al. |
| 9,407,847 B2 | 8/2016 | Maehashi et al. |
| 9,438,828 B2 | 9/2016 | Itano et al. |
| 9,509,931 B2 | 11/2016 | Kobayashi et al. |
| 9,602,752 B2 | 3/2017 | Kobayashi et al. |
| 10,015,430 B2 | 7/2018 | Kobayashi et al. |
| 10,609,316 B2 | 3/2020 | Kobayashi |
| 10,789,724 B2 | 9/2020 | Kobayashi et al. |
| 11,268,851 B2 | 3/2022 | Kobayashi et al. |
| 11,431,929 B2 | 8/2022 | Kobayashi et al. |
| 11,463,644 B2 | 10/2022 | Soda et al. |
| 11,470,275 B2 | 10/2022 | Kobayashi et al. |
| 11,495,550 B2 | 11/2022 | Toyoshima et al. |
| 11,496,704 B2 | 11/2022 | Sato et al. |
| 11,825,223 B2 | 11/2023 | Miyake |
| 2012/0175503 A1 | 7/2012 | Kuroda et al. |
| 2013/0140440 A1 | 6/2013 | Kobayashi |
| 2016/0227141 A1 | 8/2016 | Kobayashi et al. |
| 2019/0378288 A1 | 12/2019 | Kobayashi et al. |
| 2020/0382735 A1* | 12/2020 | Tagawa ............... H10F 39/8053 |
| 2021/0021770 A1 | 1/2021 | Nakazawa et al. |
| 2021/0360180 A1 | 11/2021 | Saito et al. |
| 2022/0030164 A1 | 1/2022 | Kobayashi |
| 2022/0247964 A1 | 8/2022 | Kobayashi |
| 2022/0272295 A1 | 8/2022 | Kobayashi et al. |
| 2022/0302199 A1 | 9/2022 | Kobayashi |
| 2022/0303484 A1 | 9/2022 | Kobayashi |
| 2022/0303485 A1 | 9/2022 | Kobayashi et al. |
| 2022/0303486 A1 | 9/2022 | Kobayashi |
| 2024/0121528 A1 | 4/2024 | Kito et al. |

FOREIGN PATENT DOCUMENTS

| | | |
|---|---|---|
| JP | 2019-213159 A | 12/2019 |
| WO | 2021/019972 A1 | 2/2021 |
| WO | 2022/270158 A1 | 12/2022 |

* cited by examiner

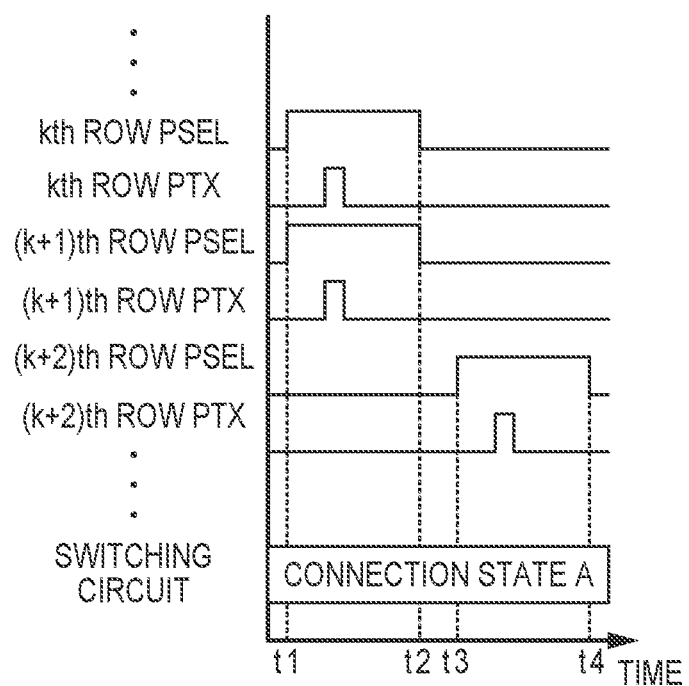

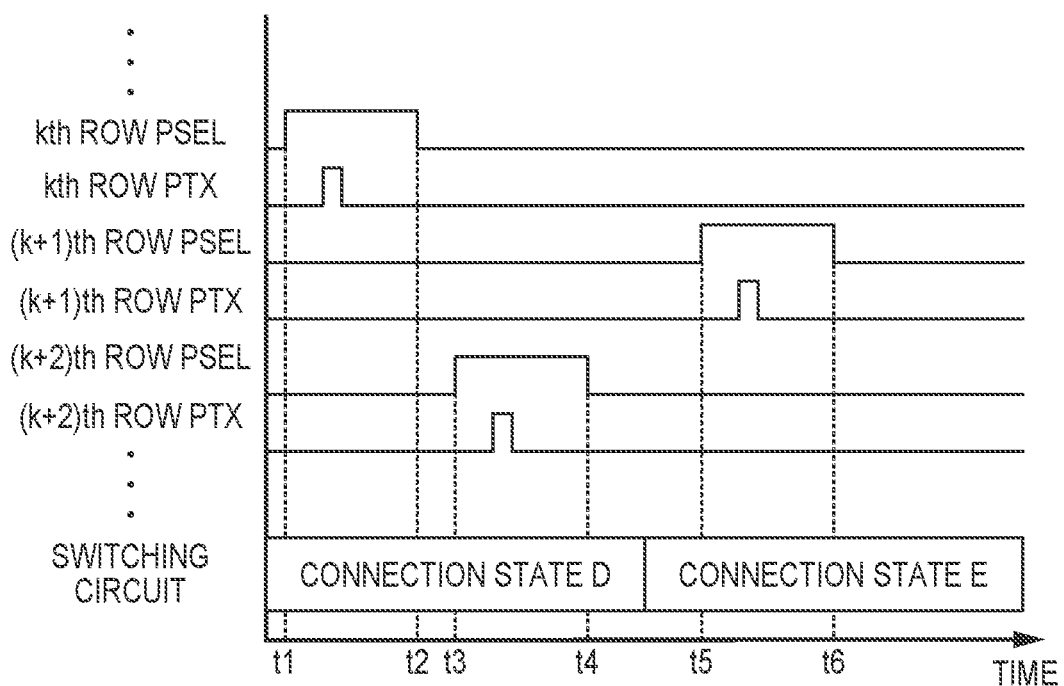
F I G. 10C

PHOTOELECTRIC CONVERSION APPARATUS AND EQUIPMENT

BACKGROUND OF THE INVENTION

Field of the Invention

The present invention relates to a photoelectric conversion apparatus and an equipment.

Description of the Related Art

Japanese Patent Laid-Open No. 2019-213159 proposes an image capturing apparatus in which two signal lines are arranged for one pixel column. A plurality of pixel circuits included in one pixel column alternately include a pixel circuit connected to one of the two signal lines and a pixel circuit connected to the other of the two signal lines. With this arrangement, it is possible to simultaneously read out signals from two pixel circuits included in the same pixel column.

SUMMARY OF THE INVENTION

According to an embodiment, a photoelectric conversion apparatus comprises: a plurality of pixel circuits; a plurality of signal lines configured to read out signals from the plurality of pixel circuits; a plurality of current sources configured to supply currents to the plurality of signal lines; a switching circuit configured to switch a connection state among the plurality of signal lines and the plurality of current sources; and a control circuit configured to control the connection state of the switching circuit. The plurality of signal lines include a first signal line and a second signal line. The plurality of current sources include a first current source and a second current source. The switching circuit can implement a first connection state in which the first signal line and the second signal line are insulated from each other, the first current source is electrically connected to the first signal line, and the second current source is electrically connected to the second signal line, and a second connection state in which at least the first current source is electrically connected to at least the second signal line. The control circuit selects the first connection state in a first operation mode, and selects the second connection state in a second operation mode.

Further features of the present invention will become apparent from the following description of exemplary embodiments with reference to the attached drawings.

BRIEF DESCRIPTION OF THE DRAWINGS

FIG. 5 is a timing chart for explaining an example of an operation in a high-speed operation mode according to some embodiments;

FIGS. 10A to 10C are timing charts for explaining examples of the operation of the photoelectric conversion apparatus according to some embodiments.

DESCRIPTION OF THE EMBODIMENTS

Figure 1:
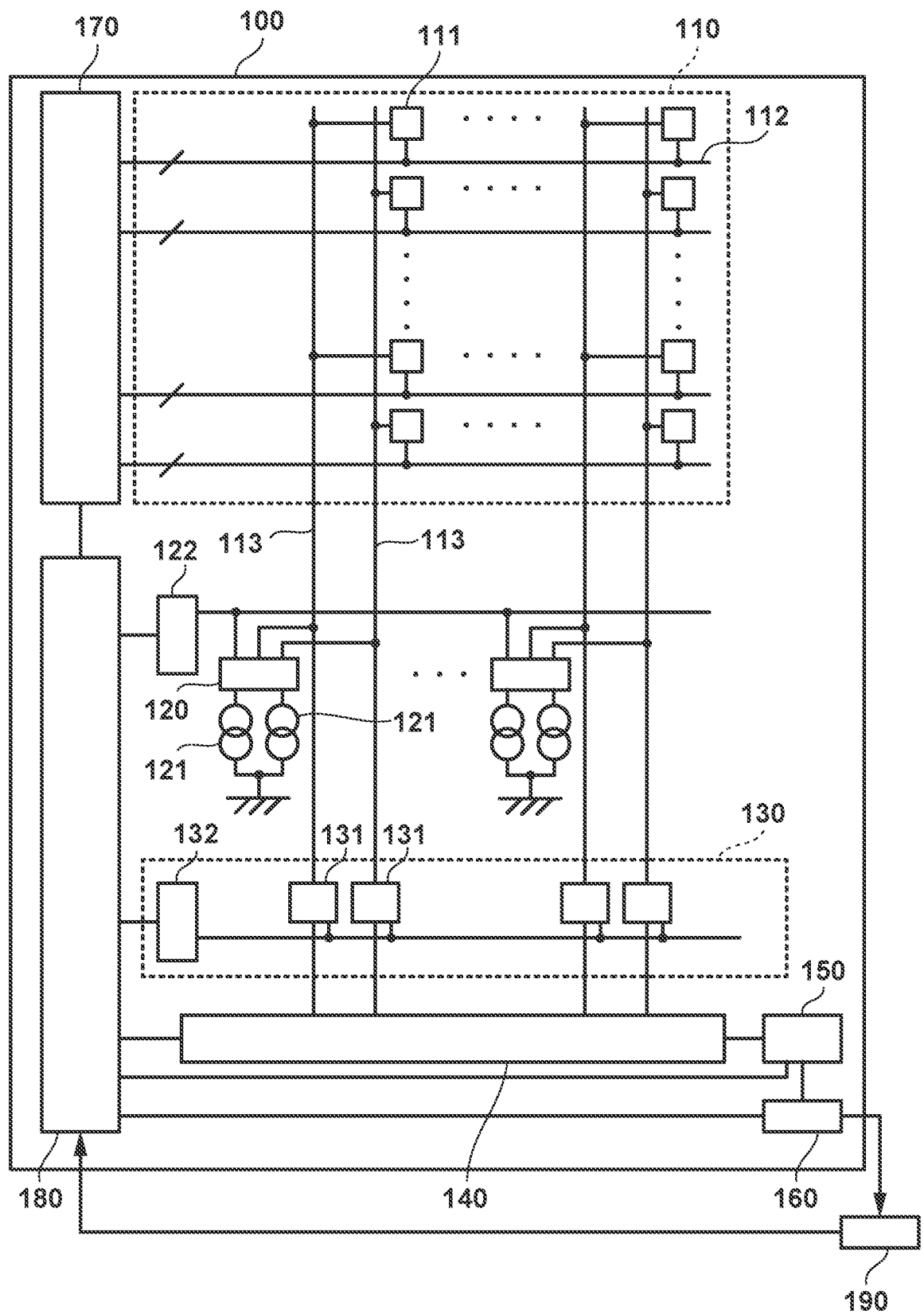
FIG. 1 is a block diagram for explaining an example of the arrangement of a photoelectric conversion apparatus according to some embodiments.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Some embodiments of the present invention relate to a photoelectric conversion apparatus. Embodiments in which a photoelectric conversion apparatus is used for image capturing will mainly be described below. In this case, the photoelectric conversion apparatus can be used as an image sensor for generating an image. Furthermore, other examples of the photoelectric conversion apparatus are a distance measuring element (a sensor used for distance measurement using focus detection or Time Of Flight (TOF)), a photometric element (a sensor used to measure an incident light amount or the like), and a Light Detection and Ranging (LiDAR) sensor. Embodiments to be described below are applicable to any photoelectric conversion apparatus.

An example of the arrangement of a photoelectric conversion apparatus 100 according to some embodiments will be described with reference to a block diagram shown in FIG. 1. In the example shown in FIG. 1, the photoelectric conversion apparatus 100 includes a pixel unit 110, an A/D conversion unit 130, a horizontal scanning circuit 140, a signal processing circuit 150, an output circuit 160, a vertical scanning circuit 170, and a timing control circuit 180. In addition, the photoelectric conversion apparatus 100 includes switching circuits 120, current sources 121, and a control circuit 122.

The pixel unit 110 includes a plurality of pixel circuits 111 arranged in a two-dimensional array to form a plurality of pixel rows and a plurality of pixel columns, a plurality of driving lines 112 each extending in the direction of the pixel row, and a plurality of signal lines 113 each extending in the direction of the pixel column. The pixel row indicates the plurality of pixel circuits 111 arranged in the horizontal direction in FIG. 1. The pixel column indicates the plurality of pixel circuits 111 arranged in the vertical direction in FIG. 1.

One driving line 112 is arranged for each of the plurality of pixel rows. The plurality of pixel circuits 111 included in one pixel row are connected to the same driving line 112. The two signal lines 113 are arranged for each (one) of the plurality of pixel columns. The plurality of pixel circuits 111 included in one pixel column are connected to one of the two signal lines 113 arranged for the one pixel column. In the example shown in FIG. 1, among the plurality of pixel circuits 111 included in one pixel column, the pixel circuits 111 included in odd-numbered pixel rows from one end (for example, the upper end) of the pixel unit 110 are connected to one (for example, a signal line 113a in FIGS. 3A to 3G) of the two signal lines 113. Among the plurality of pixel circuits 111 included in one pixel column, the pixel circuits 111 included in even-numbered pixel rows from one end (for example, the upper end) of the pixel unit 110 are connected to the other (for example, a signal line 113b in FIGS. 3A to 3G) of the two signal lines 113. In this way, the plurality of pixel circuits 111 included in one pixel column are alternately connected to the different signal lines 113. Each signal line 113 is used to read out a signal from each pixel circuit 111.

The pixel circuit 111 converts incident light into an electrical signal. Therefore, the pixel circuit 111 can also be called a light receiving circuit. The vertical scanning circuit 170 supplies a control signal to each of the plurality of pixel circuits 111 via a corresponding one of the driving lines 112. The electrical signal is read out, via a corresponding one of the signal lines 113, from the pixel circuit 111 supplied with the control signal of an active level.

The two signal lines 113 arranged for one pixel column are connected to the same switching circuit 120. Therefore, the photoelectric conversion apparatus 100 includes one switching circuit 120 for every two signal lines 113. The two current sources 121 are also connected to each of the plurality of switching circuits 120. One end of each current source 121 is connected to the switching circuit 120, and the other end of each current source 121 is connected to a ground line. Each switching circuit 120 can switch the connection relationship among the two signal lines 113 connected to itself and the two current sources 121 connected to itself. The connection states that can be implemented by the switching circuits 120 will be described later. The control circuit 122 controls the connection state of each switching circuit 120. For example, the control circuit 122 selects one of the plurality of connection states that can be implemented by the switching circuits 120, and controls the switching circuits 120 to be set in the selected connection state.

The A/D conversion unit 130 includes a plurality of A/D converters 131 provided for the signal lines 113, respectively, and a control circuit 132 for controlling the operations of the A/D converters 131. Each A/D converter 131 converts, into a digital signal, the analog signal supplied from the pixel circuit 111 via the signal line 113. In the following description, each A/D converter 131 may be a ΔΣ A/D converter, a slope A/D converter, or a successive approximation type A/D converter.

The horizontal scanning circuit 140 sequentially reads out the digital signals from the plurality of A/D converters 131, and supplies them to the signal processing circuit 150. The photoelectric conversion apparatus 100 may include, between the A/D conversion unit 130 and the horizontal scanning circuit 140, a memory circuit for storing the digital signals. The signal processing circuit 150 processes the digital signal corresponding to the electrical signal generated in each pixel circuit 111. The signal processing circuit 150 may perform, for example, correction processing, complement processing, or the like for the digital signal.

The digital signal processed by the signal processing circuit 150 is output from the output circuit 160 to an external apparatus 190 outside the photoelectric conversion apparatus 100. The external apparatus 190 may be, for example, a control apparatus of an equipment incorporating the photoelectric conversion apparatus 100. The timing control circuit 180 controls the overall operation of the photoelectric conversion apparatus 100 by supplying a control signal to each circuit of the photoelectric conversion apparatus 100.

Figure 2:
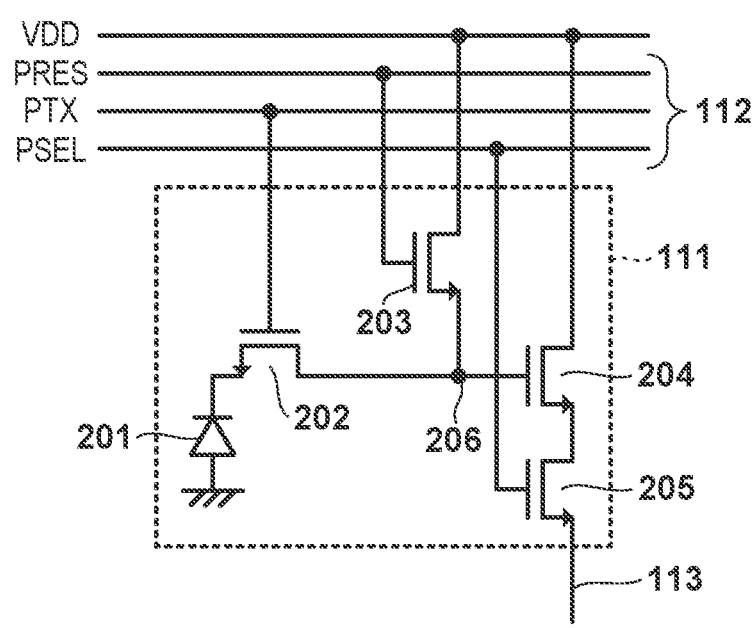
FIG. 2 is a circuit diagram for explaining an example of the arrangement of a pixel circuit according to some embodiments.

A detailed example of the circuit arrangement of the pixel circuit 111 will be described with reference to a circuit diagram shown in FIG. 2. The pixel circuit 111 can have an arbitrary arrangement for converting incident light into an electrical signal. An example will be described with reference to FIG. 2 but the pixel circuit 111 may have another arrangement.

In the example described with reference to FIG. 2, the pixel circuit 111 includes a photoelectric conversion element 201, a transfer transistor 202, a reset transistor 203, an amplification transistor 204, and a selection transistor 205. In the example shown in FIG. 2, the pixel unit 110 includes the three driving lines 112 for each pixel row, which supply control signals PRES, PTX, and PSEL to the pixel circuit 111, respectively.

The photoelectric conversion element 201 converts incident light into charges, and accumulates them. The photoelectric conversion element 201 may be, for example, a photodiode or a phototransistor. The photoelectric conversion element 201 may be a Complementary Metal Oxide Semiconductor (CMOS) sensor. Alternatively, the photoelectric conversion element 201 may be a Single Photon Avalanche Diode (SPAD) sensor.

The photoelectric conversion element 201 is connected to a floating diffusion 206 via the transfer transistor 202. The vertical scanning circuit 170 supplies the control signal PTX to the gate of the transfer transistor 202. When the control signal PTX is set to the active level, the transfer transistor 202 is set in a conductive state. The signal charges accumulated in the photoelectric conversion element 201 are accordingly transferred to the floating diffusion 206.

The floating diffusion 206 is also connected to the gate of the amplification transistor 204. One main electrode of the amplification transistor 204 is connected to the signal line 113 via the selection transistor 205. The other main electrode of the amplification transistor 204 is connected to a power supply potential VDD. The vertical scanning circuit 170 supplies the control signal PSEL to the gate of the selection transistor 205. When the control signal PSEL is set to the active level, the selection transistor 205 is set in the conductive state. The one main electrode of the amplification transistor 204 is accordingly connected to the current source 121. This causes the amplification transistor 204 to operate as a source follower, and a signal corresponding to the potential of the floating diffusion 206 is read out into the signal line 113.

The reset transistor 203 is connected between the floating diffusion 206 and the power supply potential VDD. The vertical scanning circuit 170 supplies the control signal PRES to the gate of the reset transistor 203. When the control signal PRES is set to the active level, the reset transistor 203 is set in the conductive state. The potential of the floating diffusion 206 is accordingly reset to the power supply potential VDD.

FIGS. 3A to 3G are circuit diagrams for explaining various connection states among the two signal lines 113 and the two current sources 121, which can be implemented by the switching circuit 120. In the following description, the connection states shown in FIGS. 3A to 3G are represented as connection states A to G, respectively. The switching circuit 120 may be able to implement all the connection states shown in FIGS. 3A to 3G or only the connection states used in the respective embodiments. In FIGS. 3A to 3G, the two signal lines 113 connected to each switching circuit 120 are represented as the signal lines 113a and 113b. Furthermore, the two current sources 121 connected to each switching circuit 120 are represented as current sources 121a and 121b. The signal line 113a is connected to, for example, the pixel circuits 111 included in the odd-numbered pixel rows from one end (for example, the upper end) of the pixel unit 110 among the plurality of pixel circuits 111 included in one pixel column. The signal line 113b is connected to the pixel circuits 111 included in the even-numbered pixel rows from one end (for example, the upper end) of the pixel unit 110 among the plurality of pixel circuits 111 included in one pixel column.

Figure 3A:
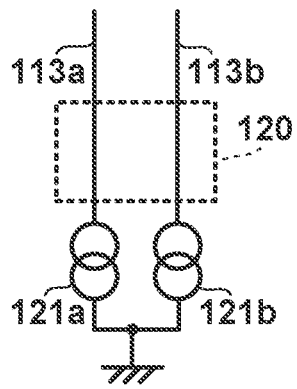
FIGS. 3A to 3G are circuit diagrams for explaining examples of the connection state of a switching circuit according to some embodiments.

FIG. 3A shows connection state A. In connection state A, the current source 121a is electrically connected to the signal line 113a and is insulated from the signal line 113b. In connection state A, the current source 121b is insulated from the signal line 113a and is electrically connected to the signal line 113b. In connection state A, the signal lines 113a and 113b are insulated from each other.

Figure 3B:
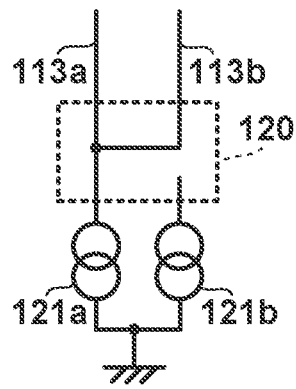

FIG. 3B shows connection state B. In connection state B, the current source 121a is electrically connected to the signal lines 113a and 113b. In connection state B, the current source 121b is insulated from the signal lines 113a and 113b. In connection state B, the signal lines 113a and 113b are electrically connected to each other.

Figure 3C:
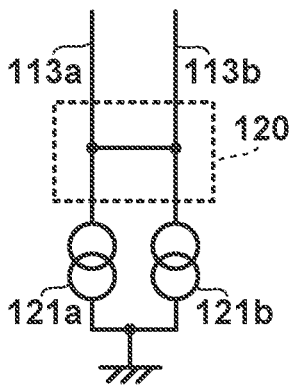

FIG. 3C shows connection state C. In connection state C, the current source 121a is electrically connected to the signal lines 113a and 113b. In connection state C, the current source 121b is electrically connected to the signal lines 113a and 113b. In connection state C, the signal lines 113a and 113b are electrically connected to each other.

Figure 3D:
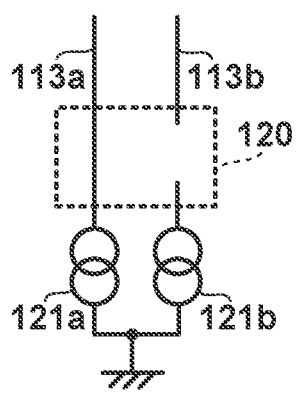

FIG. 3D shows connection state D. In connection state D, the current source 121a is electrically connected to the signal line 113a and is insulated from the signal line 113b. In connection state D, the current source 121b is insulated from the signal lines 113a and 113b. In connection state D, the signal lines 113a and 113b are insulated from each other.

Figure 3E:
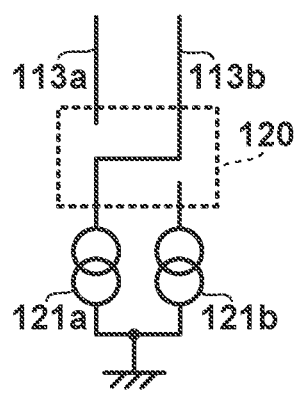

FIG. 3E shows connection state E. In connection state E, the current source 121a is insulated from the signal line 113a and is electrically connected to the signal line 113b. In connection state E, the current source 121b is insulated from the signal lines 113a and 113b. In connection state E, the signal lines 113a and 113b are insulated from each other.

Figure 3F:
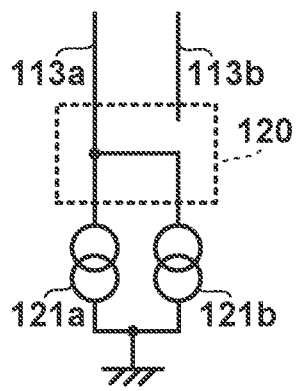

FIG. 3F shows connection state F. In connection state F, the current source 121a is electrically connected to the signal line 113a and is insulated from the signal line 113b. In connection state F, the current source 121b is electrically connected to the signal line 113a and is insulated from the signal line 113b. In connection state F, the signal lines 113a and 113b are insulated from each other.

Figure 3G:
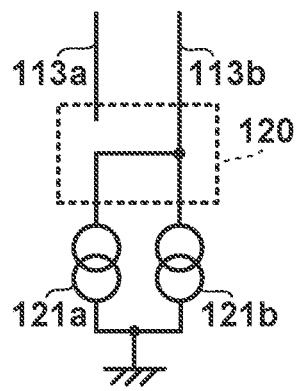

FIG. 3G shows connection state G. In connection state G, the current source 121a is insulated from the signal line 113a and is electrically connected to the signal line 113b. In connection state G, the current source 121b is insulated from the signal line 113a and is electrically connected to the signal line 113b. In connection state G, the signal lines 113a and 113b are insulated from each other.

FIGS. 4A to 4E are circuit diagrams each for explaining the detailed circuit arrangement of the switching circuit 120 for implementing at least some of the various connection states described with reference to FIGS. 3A to 3G. The circuit arrangements for implementing the connection states shown in FIGS. 3A to 3G are not limited to the examples shown in FIGS. 4A to 4E.

Figure 4A:
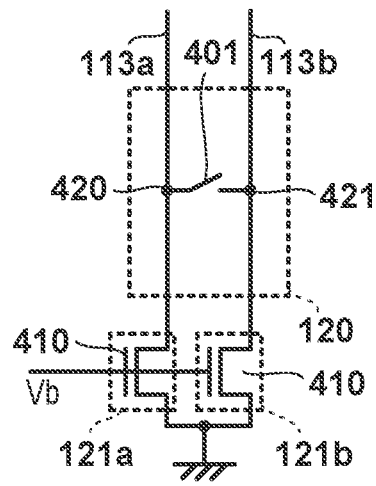
FIGS. 4A to 4E are circuit diagrams for explaining examples of the circuit arrangement of the switching circuit according to some embodiments.

FIG. 4A shows the detailed circuit arrangement of the switching circuit 120 that can implement connection states A and C. The switching circuit 120 includes a switch element 401 on a path between a node 420 on a path between the signal line 113a and the current source 121a and a node 421 on a path between the signal line 113b and the current source 121b. The nodes 420 and 421 are connected to each other by the switch element 401. The switching circuit 120 includes no circuit element on the path between the signal line 113a and the current source 121a, and includes no circuit element on the path between the signal line 113b and the current source 121b.

ON/OFF of the switch element 401 is switched by a control signal supplied from the control circuit 122. If the switch element 401 is OFF, the switching circuit 120 is in connection state A. If the switch element 401 is ON, the switching circuit 120 is in connection state C.

Each of the current sources 121a and 121b is formed by a transistor 410. A bias voltage Vb is supplied to the gate of the transistor 410 forming the current source 121a and the gate of the transistor 410 forming the current source 121b. Each transistor 410 generates a current corresponding to the bias current supplied to the gate. If the transistor 410 is electrically connected to any one of the signal lines 113, the current is supplied to the signal line 113.

Figure 4B:
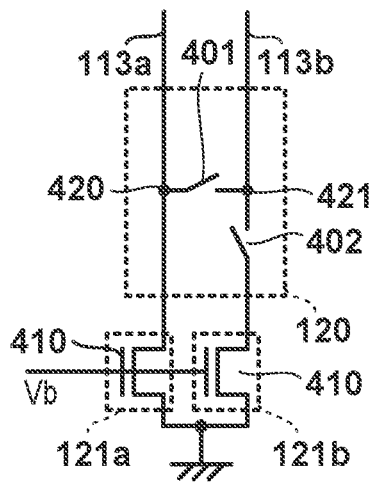

FIG. 4B shows the detailed circuit arrangement of the switching circuit 120 that can implement connection states A, B, and C. In addition to the above-described switch element 401, the switching circuit 120 includes a switch element 402 on a path between the node 421 and the current source 121b. The node 421 and the current source 121b are connected to each other by the switch element 402. The switching circuit 120 includes no circuit element on the path between the signal line 113a and the current source 121a, and includes no circuit element on a path between the signal line 113b and the switch element 402.

ON/OFF of the switch element 402 is switched by a control signal supplied from the control circuit 122. If the switch element 401 is OFF and the switch element 402 is ON, the switching circuit 120 is in connection state A. If the switch element 401 is ON and the switch element 402 is OFF, the switching circuit 120 is in connection state B. If the switch elements 401 and 402 are ON, the switching circuit 120 is in connection state C.

Figure 4C:
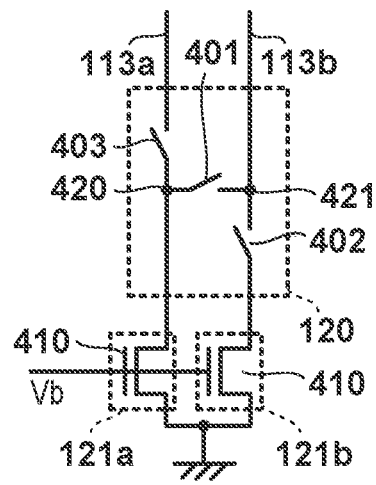

FIG. 4C shows the detailed circuit arrangement of the switching circuit 120 that can implement connection states A, B, C, D, E, and G. In addition to the above-described switch elements 401 and 402, the switching circuit 120 includes a switch element 403 on a path between the node 420 and the signal line 113a. The node 420 and the signal line 113a are connected to each other by the switch element 403. The switching circuit 120 includes no circuit element on a path between the switch element 403 and the current source 121a, and includes no circuit element on the path between the signal line 113b and the switch element 402.

ON/OFF of the switch element 403 is switched by a control signal supplied from the control circuit 122. If the switch element 401 is OFF, the switch element 402 is ON, and the switch element 403 is ON, the switching circuit 120 is in connection state A. If the switch element 401 is ON, the switch element 402 is OFF, and the switch element 403 is ON, the switching circuit 120 is in connection state B. If the switch elements 401, 402, and 403 are ON, the switching circuit 120 is in connection state C. If the switch element 401 is OFF, the switch element 402 is OFF, and the switch element 403 is ON, the switching circuit 120 is in connection state D. If the switch element 401 is ON, the switch element 402 is OFF, and the switch element 403 is OFF, the switching circuit 120 is in connection state E. If the switch element 401 is ON, the switch element 402 is ON, and the switch element 403 is OFF, the switching circuit 120 is in connection state G.

Figure 4D:
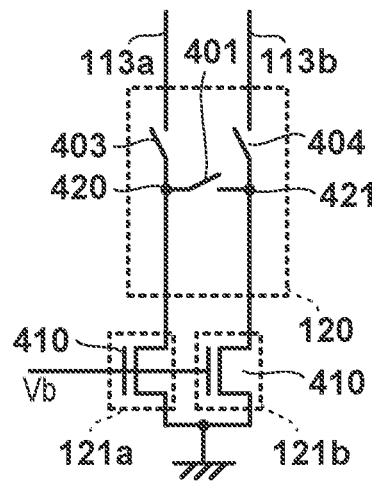

FIG. 4D shows the detailed circuit arrangement of the switching circuit 120 that can implement connection states A, C, D, F, and G. In addition to the above-described switch elements 401 and 403, the switching circuit 120 includes a switch element 404 on a path between the node 421 and the signal line 113b. The node 421 and the signal line 113b are connected to each other by the switch element 404. The switching circuit 120 includes no circuit element on the path between the switch element 403 and the current source 121a, and includes no circuit element on a path between the switch element 404 and the current source 121b.

ON/OFF of the switch element 404 is switched by a control signal supplied from the control circuit 122. If the switch element 401 is OFF, the switch element 403 is ON, and the switch element 404 is ON, the switching circuit 120 is in connection state A. If the switch elements 401, 403, and 404 are ON, the switching circuit 120 is in connection state C. If the switch element 401 is OFF, the switch element 403 is ON, and the switch element 404 is OFF, the switching circuit 120 is in connection state D. If the switch element 401 is ON, the switch element 403 is ON, and the switch element 404 is OFF, the switching circuit 120 is in connection state F. If the switch element 401 is ON, the switch element 403 is OFF, and the switch element 404 is ON, the switching circuit 120 is in connection state G.

Figure 4E:
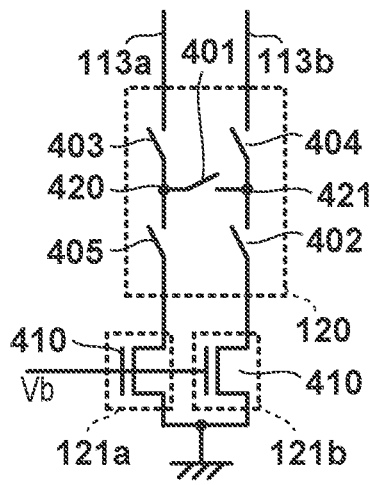

FIG. 4E shows the detailed circuit arrangement of the switching circuit 120 that can implement all connection states A to G. In addition to the above-described switch elements 401 to 404, the switching circuit 120 includes a switch element 405 on a path between the node 420 and the current source 121a. The node 420 and the current source 121a are connected to each other by the switch element 405.

ON/OFF of the switch element 405 is switched by a control signal supplied from the control circuit 122. If the switch element 401 is OFF, the switch element 402 is ON, the switch element 403 is ON, the switch element 404 is ON, and the switch element 405 is ON, the switching circuit 120 is in connection state A. If the switch element 401 is ON, the switch element 402 is OFF, the switch element 403 is ON, the switch element 404 is ON, and the switch element 405 is ON, the switching circuit 120 is in connection state B. If the switch elements 401, 402, 403, 404, and 405 are ON, the switching circuit 120 is in connection state C. If the switch element 401 is OFF, the switch element 402 is OFF, the switch element 403 is ON, the switch element 404 is OFF, and the switch element 405 is ON, the switching circuit 120 is in connection state D. If the switch element 401 is ON, the switch element 402 is OFF, the switch element 403 is OFF, the switch element 404 is ON, and the switch element 405 is ON, the switching circuit 120 is in connection state E. If the switch element 401 is ON, the switch element 402 is ON, the switch element 403 is ON, the switch element 404 is OFF, and the switch element 405 is ON, the switching circuit 120 is in connection state F. If the switch element 401 is ON, the switch element 402 is ON, the switch element 403 is OFF, the switch element 404 is ON, and the switch element 405 is ON, the switching circuit 120 is in connection state G.

An example of the operation of the photoelectric conversion apparatus 100 will be described with reference to FIGS. 5 to 6D. The photoelectric conversion apparatus 100 can operate in an operation mode selected from a high-speed operation mode of scanning the plurality of pixel rows by every two rows and a normal operation mode of scanning the plurality of pixel rows one by one.

An example of the operation of the photoelectric conversion apparatus 100 in the high-speed operation mode will be described with reference to FIG. 5. The operation shown in FIG. 5 is executed by the photoelectric conversion apparatus 100 in which each switching circuit 120 can implement connection state A. During the operation in the high-speed operation mode, the control circuit 122 selects connection state A, and supplies the control signal to the switch element in each switching circuit 120 so that the switching circuit 120 is set in connection state A. The timing control circuit 180 supplies the control signal of the active level to the driving lines 112 for every two pixel rows. This can read out signals from the pixel unit 110 at high speed. With reference to FIG. 5, a description will be provided by paying attention to timings at each of which the control signal of the active level is supplied to each of the driving lines 112 on the kth to (k+2)th rows. The remaining pixel rows are similarly controlled. The following description assumes that the pixel circuits 111 on the kth and (k+2)th rows are connected to the respective signal lines 113a and the pixel circuits 111 on the (k+1)th row are connected to the respective signal lines 113b.

At time t1, the timing control circuit 180 switches, from low level to high level, the control signal PSEL to be supplied to each of the driving lines 112 on the kth and (k+1)th pixel rows. This causes the amplification transistors 204 of the pixel circuits 111 on the kth row to electrically be connected to the respective signal lines 113a, respectively, and causes the amplification transistors 204 of the pixel circuits 111 on the (k+1)th row to electrically be connected to the respective signal lines 113b, respectively.

The timing control circuit 180 temporarily switches, to high level, the control signal PTX to be supplied to each of the driving lines 112 on the kth and (k+1)th pixel rows while the control signal PSEL is set at high level. In connection state A, each current source 121a supplies the bias current to the corresponding pixel circuit 111 on the kth row via the corresponding signal line 113a, and each current source 121b supplies the bias current to the corresponding pixel circuits 111 on the (k+1)th row via the corresponding signal lines 113b. Since the signal lines 113a and 113b are insulated from each other, signals are simultaneously individually read out from the pixel circuits 111 on the kth and (k+1)th rows.

At time t2, the timing control circuit 180 switches, from high level to low level, the control signal PSEL to be supplied to each of the driving lines 112 on the kth and (k+1)th pixel rows. This causes the amplification transistors 204 of the pixel circuits 111 on the kth row to be insulated from the signal lines 113a, respectively, and causes the amplification transistors 204 of the pixel circuits 111 on the (k+1)th row to be insulated from the signal lines 113b, respectively.

During a period from time t3 to time t4, signals are simultaneously individually read out from the pixel circuits 111 on the (k+2)th and (k+3)th rows, similar to the period from time t1 to time t2.

An example of the operation of the photoelectric conversion apparatus 100 in the normal operation mode will be described with reference to FIGS. 6A to 6D. FIGS. 6A to 6D show individual embodiments of the photoelectric conversion apparatus 100 operating in the normal operation mode. In any of the embodiments, the timing control circuit 180 supplies the control signal of the active level to the driving line 112 for every pixel row. This can read out a signal from the pixel unit 110 with low power. In the normal operation mode, signals are individually read out from each of the plurality of pixel rows. With reference to FIGS. 6A to 6D, a description will be provided by paying attention to timings at each of which the control signal of the active level is supplied to each of the driving lines 112 on the kth to (k+2)th pixel rows. The remaining pixel rows are similarly controlled. The following description assumes that the pixel circuits 111 on the kth and (k+2)th rows are connected to the respective signal lines 113a and the pixel circuits 111 on the (k+1)th row are connected to the respective signal lines 113b.

Figure 6A:
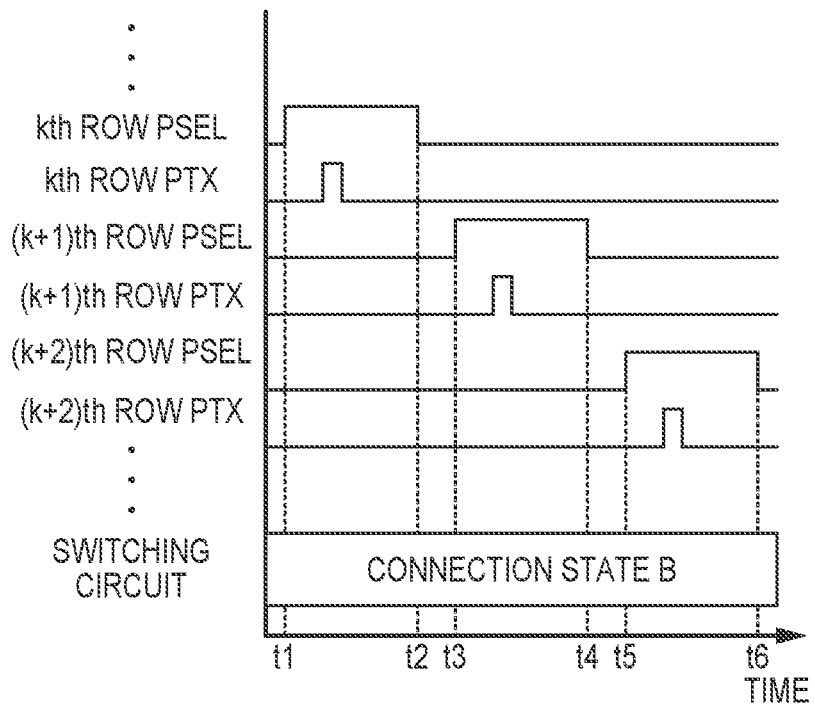
FIGS. 6A to 6D are timing charts for explaining examples of an operation in a normal operation mode according to some embodiments.

The operation according to the embodiment shown in FIG. 6A is executed by the photoelectric conversion apparatus 100 in which each switching circuit 120 can implement connection state B. During the operation in the normal operation mode, the control circuit 122 selects connection state B, and supplies the control signal to the switch element in each switching circuit 120 so that the switching circuit 120 is set in connection state B.

At time t1, the timing control circuit 180 switches, from low level to high level, the control signal PSEL to be supplied to the driving line 112 on the kth pixel row. This causes the amplification transistors 204 of the pixel circuits 111 on the kth row to electrically be connected to the signal lines 113a, respectively.

The timing control circuit 180 temporarily switches, to high level, the control signal PTX to be supplied to the driving line 112 on the kth pixel row while the control signal PSEL is set at high level. In connection state B, each current source 121a supplies the bias current to the corresponding pixel circuit 111 on the kth row via the corresponding signal line 113a. By using the bias current, signals are read out from the pixel circuits 111 on the kth row via the signal lines 113a, respectively.

In connection state B, since the signal lines 113a and 113b are electrically connected to each other, each current source 121a also supplies the bias current to the pixel circuit 111 connected to the signal line 113b. However, since the signal line 113b is insulated from any of the amplification transistors 204 of the pixel circuits 111, no signal is read out via the signal line 113b.

At time t2, the timing control circuit 180 switches, from high level to low level, the control signal PSEL to be supplied to the driving line 112 on the kth pixel row. This causes the amplification transistors 204 of the pixel circuits 111 on the kth row to be insulated from the signal lines 113a, respectively.

At time t3, the timing control circuit 180 switches, from low level to high level, the control signal PSEL to be supplied to the driving line 112 on the (k+1)th pixel row. This causes the amplification transistors 204 of the pixel circuits 111 on the (k+1) row to electrically be connected to the signal lines 113b, respectively.

The timing control circuit 180 temporarily switches, to high level, the control signal PTX to be supplied to the driving line 112 on the (k+1)th pixel row while the control signal PSEL is set at high level. In connection state B, each current source 121a supplies the bias current to the corresponding pixel circuit 111 on the (k+1)th row via the corresponding signal line 113b. By using the bias current, signals are read out from the pixel circuits 111 on the (k+1)th row via the signal lines 113b, respectively.

In connection state B, since the signal lines 113a and 113b are electrically connected to each other, each current source 121a also supplies the bias current to the pixel circuit 111 connected to the signal line 113a. However, since the signal line 113a is insulated from any of the amplification transistors 204 of the pixel circuits 111, no signal is read out via the signal line 113a.

At time t4, the timing control circuit 180 switches, from high level to low level, the control signal PSEL to be supplied to the driving line 112 on the (k+1)th pixel row. This causes the amplification transistors 204 of the pixel circuits 111 on the (k+1)th row to be insulated from the signal lines 113b, respectively.

During a period from time t5 to time t6, signals are read out from the pixel circuits 111 on the (k+2)th row, similar to the period from time t1 to time t2.

Figure 6B:
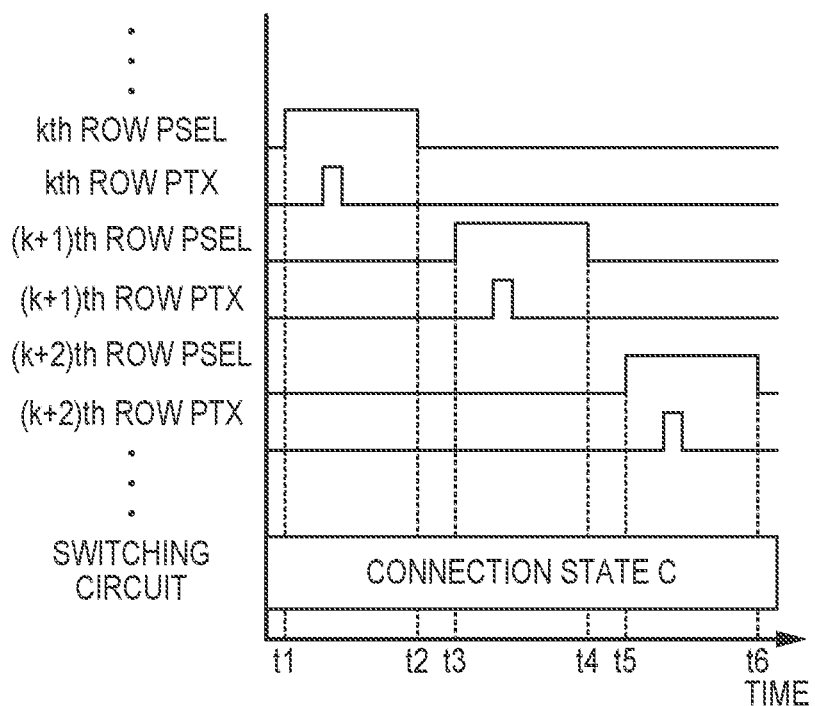

The operation according to the embodiment shown in FIG. 6B is executed by the photoelectric conversion apparatus 100 in which each switching circuit 120 can implement connection state C. During the operation in the normal operation mode, the control circuit 122 selects connection state C, and supplies the control signal to the switch element in each switching circuit 120 so that the switching circuit 120 is set in connection state C. The embodiment shown in FIG. 6B is different from that shown in FIG. 6A in that both the current sources 121a and 121b supply the bias currents to the signal lines 113a and 113b, and the remaining points may be the same. A repetitive description will be omitted.

Figure 6C:
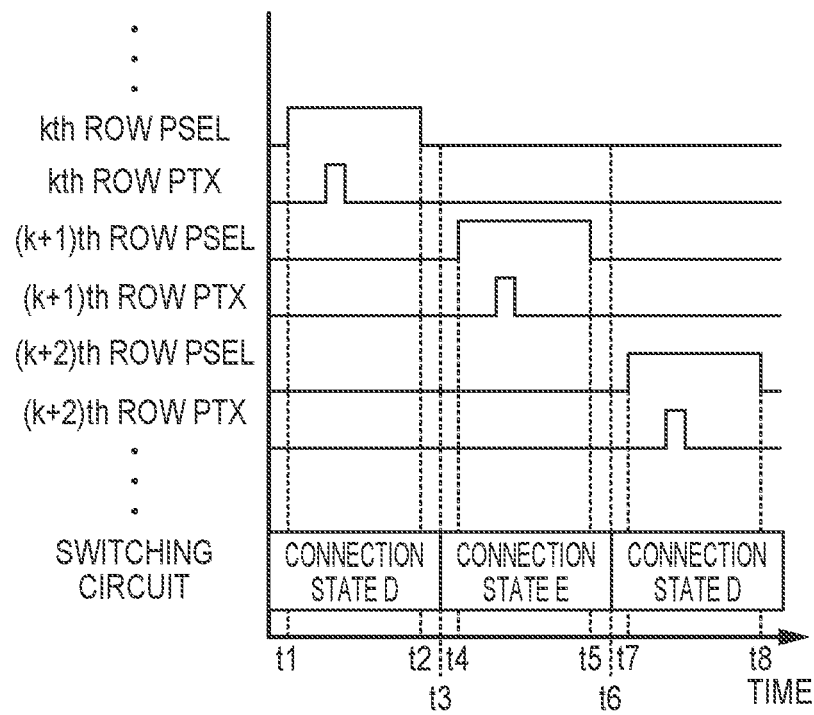

The operation according to the embodiment shown in FIG. 6C is executed by the photoelectric conversion apparatus 100 in which each switching circuit 120 can implement connection states D and E. During the operation in the normal operation mode, the control circuit 122 alternately selects connection states D and E, and supplies the control signal to the switch element in each switching circuit 120 so that the switching circuit 120 is set in the selected connection state.

At time t1, the timing control circuit 180 switches, from low level to high level, the control signal PSEL to be supplied to the driving line 112 on the kth pixel row. This causes the amplification transistors 204 of the pixel circuits 111 on the kth row to electrically be connected to the signal lines 113a, respectively. At time t1, each switching circuit 120 is in connection state D.

The timing control circuit 180 temporarily switches, to high level, the control signal PTX to be supplied to the driving line 112 on the kth pixel row while the control signal PSEL is set at high level. In connection state D, each current source 121a supplies the bias current to the corresponding pixel circuit 111 on the kth row via the corresponding signal line 113a. By using the bias current, signals are read out from the pixel circuits 111 on the kth row via the signal lines 113a, respectively. In connection state D, since the signal line 113b is insulated from the current sources 121a and 121b, no bias current is supplied to the pixel circuit 111 connected to the signal line 113b.

At time t2, the timing control circuit 180 switches, from high level to low level, the control signal PSEL to be supplied to the driving line 112 on the kth pixel row. This causes the amplification transistors 204 of the pixel circuits 111 on the kth row to be insulated from the signal lines 113a, respectively.

At time t3, the timing control circuit 180 switches each switching circuit 120 from connection state D to connection state E by controlling the control circuit 122.

At time t4, the timing control circuit 180 switches, from low level to high level, the control signal PSEL to be supplied to the driving line 112 on the (k+1)th pixel row. This causes the amplification transistors 204 of the pixel circuits 111 on the (k+1)th row to electrically be connected to the signal lines 113*b*, respectively.

The timing control circuit 180 temporarily switches, to high level, the control signal PTX to be supplied to the driving line 112 on the (k+1)th pixel row while the control signal PSEL is set at high level. In connection state E, each current source 121*a* supplies the bias current to the corresponding pixel circuit 111 on the (k+1)th row via the corresponding signal line 113*b*. By using the bias current, signals are read out from the pixel circuits 111 on the (k+1)th row via the signal lines 113*b*, respectively. In connection state E, since the signal line 113*a* is insulated from the current sources 121*a* and 121*b*, no bias current is supplied to the pixel circuit 111 connected to the signal line 113*a*.

At time t5, the timing control circuit 180 switches, from high level to low level, the control signal PSEL to be supplied to the driving line 112 on the (k+1)th pixel row. This causes the amplification transistors 204 of the pixel circuits 111 on the (k+1)th row to be insulated from the signal lines 113*b*, respectively.

At time t6, the timing control circuit 180 switches each switching circuit 120 from connection state E to connection state D by controlling the control circuit 122. During a period from time t7 to time t8, signals are read out from the pixel circuits 111 on the (k+2)th row, similar to the period from time t1 to time t2.

Figure 6D:
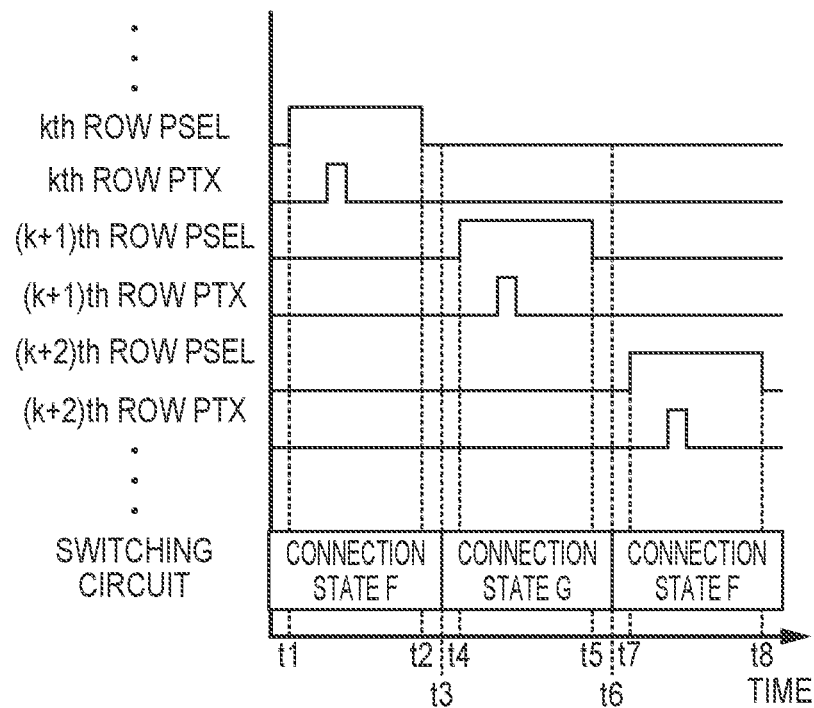

The operation according to the embodiment shown in FIG. 6D is executed by the photoelectric conversion apparatus 100 in which each switching circuit 120 can implement connection states F and G. During the operation in the normal operation mode, the control circuit 122 alternately selects connection states F and G, and supplies the control signal to the switch element in each switching circuit 120 so that the switching circuit 120 is set in the selected connection state.

The embodiment shown in FIG. 6D is different from that shown in FIG. 6C in that connection state F is selected instead of connection state D and connection state G is selected instead of connection state E, and the remaining points may be the same. A repetitive description will be omitted. In the embodiment shown in FIG. 6D, both the current sources 121*a* and 121*b* supply the bias currents to the signal line 113*a* or 113*b*.

The effects of the above-described embodiments shown in FIGS. 6A to 6D will be described below. As a comparative example, a case in which supply of the bias current from the current source 121*a* via the signal line 113*a* and supply of the bias current from the current source 121*b* via the signal line 113*b* are alternately performed will be described. If a signal is read out from the pixel circuit 111 via the signal line 113*a*, no signal is read out from the pixel circuit 111 via the signal line 113*b*. Therefore, the potential of the signal line 113*b* lowers near a ground potential by the bias current supplied from the current source 121*b*. On the other hand, the potential of the signal line 113*a* rises from a potential near the ground potential to a signal voltage. This change causes the drain voltage of the transistor 410 to vary, and also causes the bias voltage Vb to vary via the gate-drain capacitance. If the apparatus stands by until the bias voltage Vb becomes stable, the speed of reading out a signal from the pixel circuit 111 is decreased.

On the other hand, in any of the above-described embodiments, the same current source supplies the bias current to the pixel circuits 111 on the plurality of pixel rows (that is, the pixel circuits 111 on the odd-numbered rows and the pixel circuits 111 on the even-numbered rows). More specifically, in the embodiments shown in FIGS. 6A and 6C, only the current source 121*a* supplies the bias current. In FIGS. 6B and 6D, both the current sources 121*a* and 121*b* supply the bias currents. In the embodiments shown in FIGS. 6C and 6D, since the signal line 113 that is not used to read out a signal is insulated from the pixel circuits 111 and the current sources 121, it is set in a floating state. Therefore, this signal line holds a potential before disconnection, and does not lower near the ground potential. Thus, in the above-described embodiments, the variation of the bias voltage Vb as in the comparative example is suppressed, and it is thus possible to suppress a decrease in speed of reading out a signal from the pixel circuit 111.

In the embodiments shown in FIGS. 6C and 6D, a state in which the signal lines 113*a* and 113*b* are insulated from each other is maintained. This can reduce the capacity load caused by connection of the signal line 113*b* when reading out a signal from the pixel circuit 111 via the signal line 113*a*, and thus the photoelectric conversion apparatus 100 can operate at high speed.

In the embodiments shown in FIGS. 6B and 6D, both the current sources 121*a* and 121*b* supply the bias currents to the signal line 113. Therefore, even if the bias voltage Vb is lowered, a current equal to that in the high-speed operation mode in which one current source 121 supplies the bias current can be supplied to the signal line 113. Even if the potential of the signal line 113 lowers, the transistor 410 of the current source 121 can operate in a saturated region, thereby improving the dynamic range of the signal line 113.

Figure 7A:
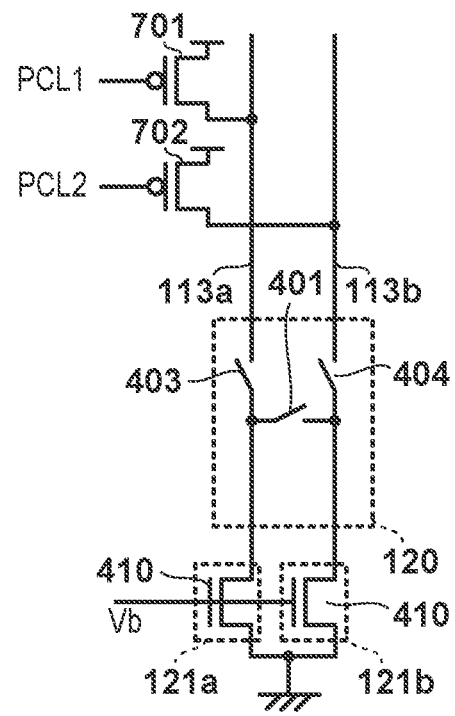
FIGS. 7A and 7B are a circuit diagram and a timing chart for explaining a modification of the photoelectric conversion apparatus according to some embodiments.
Figure 7B:
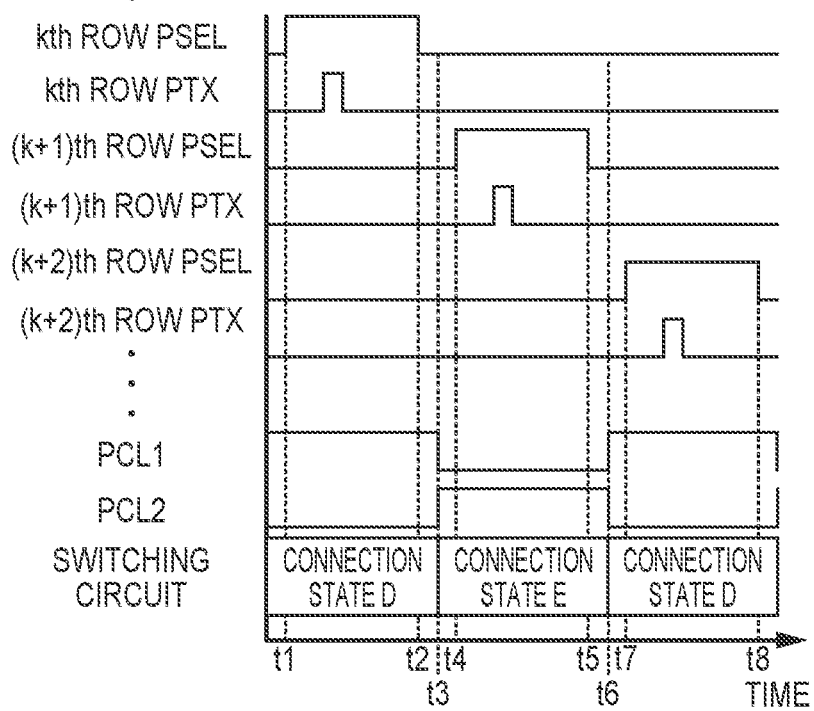

A modification of the above-described embodiments shown in FIGS. 6C and 6D will be described with reference to FIGS. 7A and 7B. The modification will be described as a difference from the embodiment shown in FIG. 6C but the embodiment shown in FIG. 6D can similarly be modified. As shown in FIG. 7A, in this modification, the photoelectric conversion apparatus 100 further includes a P-type transistor 701 connected to the signal line 113*a* and a P-type transistor 702 connected to the signal line 113*b*.

One main electrode of the P-type transistor 701 is connected to the signal line 113*a*, and the other main electrode of the P-type transistor 701 is connected to a power supply voltage line. If a control signal PCL1 to be supplied to the gate of the P-type transistor 701 is at high level, the P-type transistor 701 is set in a non-conductive state. On the other hand, if the control signal PCL1 is at low level, the P-type transistor 701 is set in a conductive state, and the signal line 113*a* is electrically connected to the power supply voltage line. In this way, the P-type transistor 701 functions as a stabilization circuit for stabilizing the potential of the signal line 113*a*. More specifically, the P-type transistor 701 operates to stabilize the potential of the signal line 113*a* when the control signal of low level is supplied, and does not perform such operation when the control signal of high level is supplied. The P-type transistor 702 also has the same arrangement as that of the P-type transistor 701, and functions as a stabilization circuit for stabilizing the potential of the signal line 113*b*.

An operation according to the modification shown in FIG. 7A will be described with reference to FIG. 7B. Operations of components other than the P-type transistors 701 and 702 may be the same as those described with reference to FIG. 6C and a description thereof will be omitted.

When selecting connection state D as the connection state of the switching circuit 120, the timing control circuit 180 does not operate the P-type transistor 701 and operates the P-type transistor 702. This fixes the signal line 113b to the power supply voltage without being floated. When selecting connection state E as the connection state of the switching circuit 120, the timing control circuit 180 operates the P-type transistor 701 and does not operate the P-type transistor 702. This fixes the signal line 113a to the power supply voltage without being floated. By stabilizing (more specifically, fixing to the power supply voltage) the potential of the signal line 113 insulating from the current source 121, it is possible to reduce noise generating in the signal line 113 from which a signal is read out.

Figure 8:
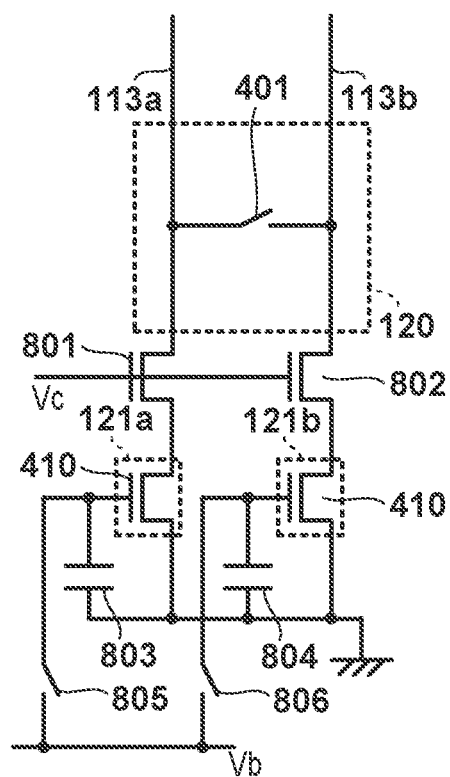
FIG. 8 is a circuit diagram for explaining a modification of the photoelectric conversion apparatus according to some embodiments.

A modification of the embodiments shown in FIGS. 6A to 6D will be described with reference to FIG. 8. A case in which the switching circuit 120 has the circuit arrangement shown in FIG. 4A will be described below but the switching circuit 120 may have another circuit arrangement.

The photoelectric conversion apparatus 100 further includes a transistor 801 on a path between the current source 121a and the switching circuit 120 and a transistor 802 on a path between the current source 121b and the switching circuit 120. A bias voltage Vc is supplied to the gates of the transistors 801 and 802. The transistors 801 and 802 function as cascade transistors. In this embodiment as well, in the normal operation mode, the transistors 801 and 802 used to supply the bias currents to each of the plurality of pixel rows can be fixed. Therefore, similar to FIGS. 6A to 6D, it is possible to suppress the variation of the bias voltage Vc.

The photoelectric conversion apparatus 100 further includes a sample-and-hold circuit formed by a capacitance 803 and a switch element 805 and a sample-and-hold circuit formed by a capacitance 804 and a switch element 806. The sample-and-hold circuit formed by the capacitance 803 and the switch element 805 is connected to the current source 121a (more specifically, the gate of the transistor 410), and holds the bias voltage Vb to be supplied to the current source 121a. The sample-and-hold circuit formed by the capacitance 804 and the switch element 806 is connected to the current source 121b (more specifically, the gate of the transistor 410), and holds the bias voltage Vb to be supplied to the current source 121b.

In the above-described photoelectric conversion apparatus 100, the two signal lines 113 are arranged for one pixel column. Instead, three or more signal lines 113 may be arranged for one pixel column.

In this case, the three or more signal lines 113 arranged for one pixel column are connected to the switching circuit 120. Accordingly, the current sources 121 the number of which is equal to the number of signal lines 113 are connected to the switching circuit 120. It is possible to simultaneously read out signals from the pixel circuits 111 on rows the number of which is equal to the number of signal lines 113 arranged for one pixel column.

Figure 9:
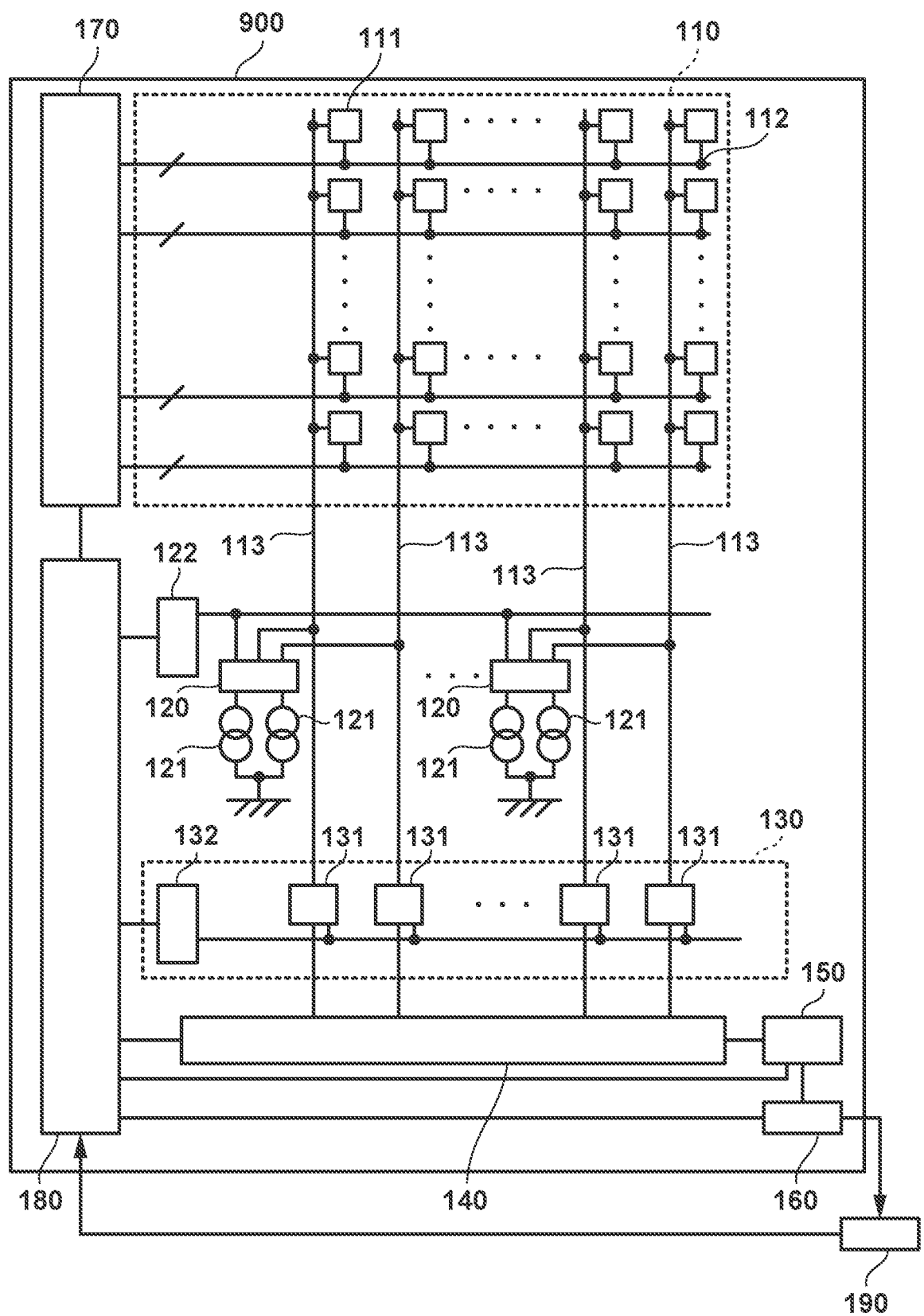
FIG. 9 is a block diagram for explaining an example of the arrangement of a photoelectric conversion apparatus according to some embodiments.

A photoelectric conversion apparatus 900 according to another embodiment will be described with reference to FIGS. 9 to 10C. In the photoelectric conversion apparatus 900, one signal line 113 is arranged for each (one) of a plurality of pixel columns. A plurality of pixel circuits 111 included in one pixel column are connected to the one signal line 113 arranged for the one pixel column. Similar to the photoelectric conversion apparatus 100, in the photoelectric conversion apparatus 900 as well, the two signal lines 113 are connected to one switching circuit 120. Unlike the photoelectric conversion apparatus 100, in the photoelectric conversion apparatus 900, the two signal lines 113 connected to the one switching circuit 120 are arranged for different pixel columns.

Figure 10A:
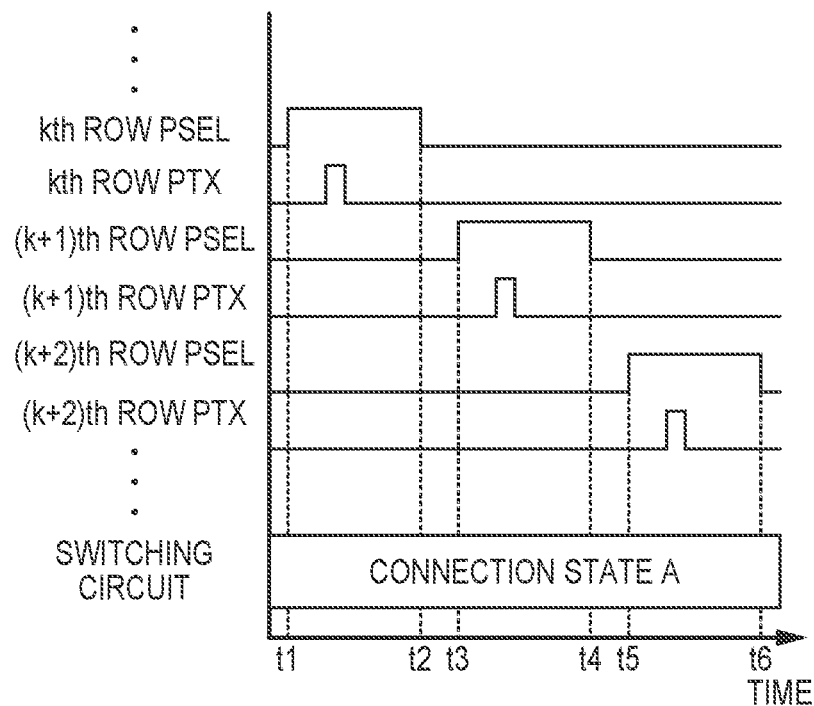
Figure 10B:
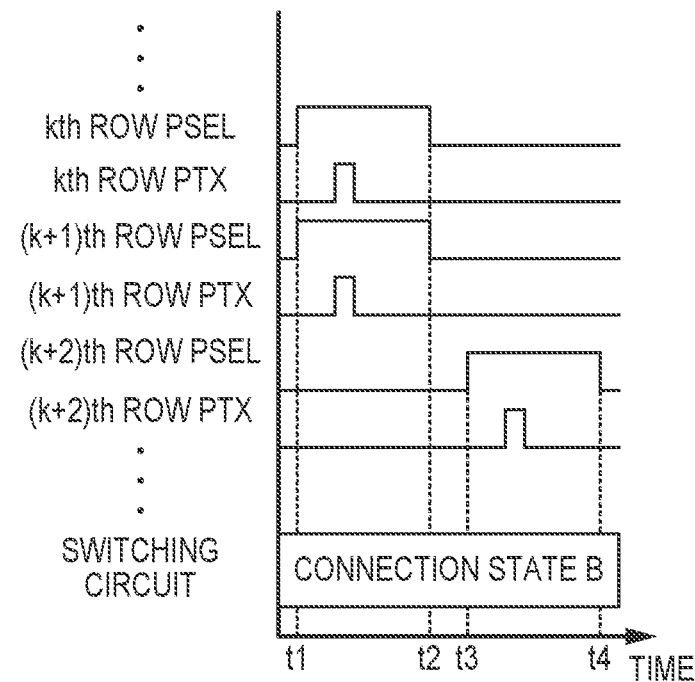

An example of the operation of the photoelectric conversion apparatus 900 will be described with reference to FIGS. 10A to 10C. The photoelectric conversion apparatus 900 can operate in an operation mode selected from a high-resolution operation mode of reading out a signal from each of the plurality of pixel circuits 111 and a low-resolution operation mode of reading out a signal with a resolution lower than that in the high-resolution operation mode.

An example of the operation of the photoelectric conversion apparatus 900 in the high-resolution operation mode will be described with reference to FIG. 10A. The operation shown in FIG. 10A is executed by the photoelectric conversion apparatus 900 in which the switching circuits 120 can implement connection state A. During the operation in the high-resolution operation mode, a control circuit 122 selects connection state A, and supplies a control signal to a switch element in each switching circuit 120 so that the switching circuit 120 is set in connection state A. A timing control circuit 180 supplies a control signal of an active level to a driving line 112 for each pixel row. This can read out a signal from a pixel unit 110 with a high resolution. With reference to FIG. 10A, a description will be provided by paying attention to timings at each of which the control signal of the active level is supplied to each of the driving lines 112 on the kth to (k+2)th rows. The remaining pixel rows are similarly controlled.

At time t1, the timing control circuit 180 switches, from low level to high level, a control signal PSEL to be supplied to the driving line 112 on the kth pixel row. This causes amplification transistors 204 of the pixel circuits 111 on the kth row to electrically be connected to the signal lines 113, respectively.

The timing control circuit 180 temporarily switches, to high level, a control signal PTX to be supplied to the driving line 112 on the kth pixel row while the control signal PSEL is set at high level. In connection state A, each current source 121 supplies a bias current to a corresponding one of the plurality of pixel circuits 111 included in the kth pixel row via a corresponding one of the signal lines 113 arranged for the respective pixel columns. Since the plurality of signal lines 113 are insulated from each other, signals are individually read out from the plurality of pixel circuits 111 included in the kth pixel row.

At time t2, the timing control circuit 180 switches, from high level to low level, the control signal PSEL to be supplied to the driving line 112 on the kth pixel row. This causes the amplification transistors 204 of the pixel circuits 111 on the kth row to be insulated from the signal lines 113, respectively.

During a period from time t3 to time t4, signals are read out from the pixel circuits 111 on the (k+1)th row, similar to the period from time t1 to time t2. During a period from time t5 to time t6, signals are read out from the pixel circuits 111 on the (k+2)th row, similar to the period from time t1 to time t2.

An example of the operation of the photoelectric conversion apparatus 900 in the low-resolution operation mode will be described with reference to FIG. 10B. The operation shown in FIG. 10B is executed by the photoelectric conversion apparatus 900 in which the switching circuits 120 can implement connection state B. During the operation in the low-resolution operation mode, the control circuit 122 selects connection state B, and supplies the control signal to the switch element in each switching circuit 120 so that the switching circuit 120 is set in connection state B. The control circuit 122 may select connection state C instead of connection state B.

In the example of the operation, one signal is read out from the four pixel circuits 111 of 2 rows×2 column. The timing control circuit 180 supplies the control signal of the active level to the driving lines 112 for every two pixel rows. With reference to FIG. 10B, a description will be provided by paying attention to timings at each of which the control signal of the active level is supplied to each of the driving lines 112 on the kth to (k+2)th pixel rows. The remaining pixel rows are similarly controlled.

At time t1, the timing control circuit 180 switches, from low level to high level, the control signal PSEL to be supplied to each of the driving lines 112 on the kth and (k+1)th pixel rows. This causes the amplification transistors 204 of the pixel circuits 111 on the kth and (k+1)th rows included in the same pixel column to electrically be connected to the same signal line 113. In connection state B, the current sources 121 supply the bias currents to the two signal lines 113 arranged for two adjacent pixel columns.

The timing control circuit 180 temporarily switches, to high level, the control signal PTX to be supplied to each of the driving lines 112 on the kth and (k+1)th pixel rows while the control signal PSEL is set at high level. In connection state B, the two signal lines 113 arranged for the two adjacent pixel columns are electrically connected to each other. Therefore, signals of the four pixel circuits 111 existing on the kth and (k+1)th rows and included in the two adjacent pixel columns are combined and read out from the two signal lines 113.

At time t2, the timing control circuit 180 switches, from high level to low level, the control signal PSEL to be supplied to each of the driving lines 112 on the kth and (k+1)th pixel rows. This causes the amplification transistors 204 of the pixel circuits 111 on the kth and (k+1)th rows to be insulated from the signal lines 113, respectively.

During a period from time t3 to time t4, a signal is read out from the pixel circuits 111 on the (k+1)th and (k+2)th rows, similar to the period from time t1 to time t2.

Another example of the operation of the photoelectric conversion apparatus 900 in the low-resolution operation mode will be described with reference to FIG. 10C. The operation shown in FIG. 10C is executed by the photoelectric conversion apparatus 900 in which the switching circuits 120 can implement connection states D and E. During the operation in the low-resolution operation mode, the control circuit 122 alternately selects connection states D and E, and supplies the control signal to the switch element in each switching circuit 120 so that the switching circuit 120 is set in the selected connection state. The control circuit 122 may select connection states F and G instead of connection states D and E. In the operation shown in FIG. 10C, the photoelectric conversion apparatus 900 generates a plurality of images. The photoelectric conversion apparatus 900 sets the switching circuits 120 in connection state D, and generates one image using the half (for example, odd-numbered pixel rows) of the plurality of pixel rows and the half (for example, odd-numbered pixel columns) of the plurality of pixel columns. After that, the photoelectric conversion apparatus 900 sets the switching circuits 120 in connection state E, and generates another image using the other half (for example, even-numbered rows) of the plurality of pixel rows and the other half (for example, even-numbered pixel columns) of the plurality of pixel columns.

At time t1, the timing control circuit 180 switches, from low level to high level, the control signal PSEL to be supplied to the driving line 112 on the kth pixel row. At this time, connection state D is selected. This causes the amplification transistors 204 of the half (for example, the pixel circuits 111 on the odd-numbered columns) of the plurality of pixel circuits 111 included in the kth row to electrically be connected to the signal lines 113, respectively.

The timing control circuit 180 temporarily switches, to high level, the control signal PTX to be supplied to the driving line 112 on the kth pixel row while the control signal PSEL is set at high level. This individually reads out signals from the half (for example, the pixel circuits 111 on the odd-numbered columns) of the plurality of pixel circuits 111 included in the kth row.

At time t2, the timing control circuit 180 switches, from high level to low level, the control signal PSEL to be supplied to the driving line 112 on the kth pixel row. This causes the amplification transistors 204 of the pixel circuits 111 on the kth row to be insulated from the signal lines 113, respectively.

During a period from time t3 to time t4, signals are read out from the half (for example, the pixel circuits 111 on the odd-numbered columns) of the plurality of the pixel circuits 111 included in the (k+2)th row, similar to the period from time t1 to time t2. By repeating this operation up to the last pixel row, one image is generated. After that, the control circuit 122 switches the connection state from connection state D to connection state E.

At time t5, the timing control circuit 180 switches, from low level to high level, the control signal PSEL to be supplied to the driving line 112 on the (k+1)th pixel row. At this time, connection state E is selected. This causes the amplification transistors 204 of the other half (for example, the pixel circuits 111 on the even-numbered columns) of the plurality of pixel circuits 111 included in the (k+1)th row to electrically be connected to the signal lines 113, respectively.

The timing control circuit 180 temporarily switches, to high level, the control signal PTX to be supplied to the driving line 112 on the (k+1)th pixel row while the control signal PSEL is set at high level. This individually reads out signals from the other half (for example, the pixel circuits 111 on the even-numbered columns) of the plurality of pixel circuits 111 included in the (k+1)th row.

At time t6, the timing control circuit 180 switches, from high level to low level, the control signal PSEL to be supplied to the driving line 112 on the (k+1)th pixel row. This causes the amplification transistors 204 of the pixel circuits 111 on the (k+1)th row to be insulated from the signal lines 113, respectively. By repeating this operation up to the last pixel row, another image is generated. After that, to generate a further image, the control circuit 122 switches the connection state from connection state E to connection state D.

The above-described effects of the photoelectric conversion apparatus 100 can be obtained even by the photoelectric conversion apparatus 900. A modification for the photoelectric conversion apparatus 100 may be made for the photoelectric conversion apparatus 900.

In the above-described photoelectric conversion apparatus 900, the two signal lines 113 are arranged for one switching circuit 120. Instead, three or more signal lines 113 may be arranged for one pixel column. In this case, the three or more signal lines 113 arranged for one pixel column are connected to the switching circuit 120. Accordingly, the current sources 121 the number of which is equal to the number of signal lines 113 are connected to the switching circuit 120.

OTHER EMBODIMENTS

Figure 11A:
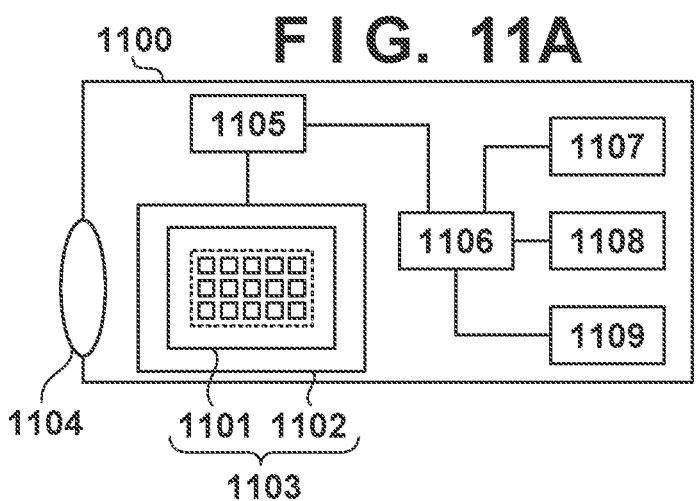
FIGS. 11A to 11C are views for explaining an equipment according to various embodiments.

An embodiment of an equipment 1100 including a semiconductor apparatus 1103 will be described in detail with reference to FIG. 11A. The semiconductor apparatus 1103 may correspond to a photoelectric conversion apparatus according to any one of the above-described embodiments. The semiconductor apparatus 1103 may include a semiconductor device 1101 and a package 1102 accommodating the semiconductor device 1101. The package 1102 may include a base on which the semiconductor device 1101 is fixed and a cover made of glass or the like facing the semiconductor device 1101. The package 1102 may further include a connection member such as a bonding wire and bump for connecting a terminal of the base and a terminal (bonding pad) of the semiconductor device 1101.

The equipment 1100 may include at least one of an optical apparatus 1104, a control apparatus 1105, a processing apparatus 1106, a display apparatus 1107, a storage apparatus 1108, and/or a mechanical apparatus 1109. The optical apparatus 1104 is implemented by, for example, a lens, a shutter, and a mirror. The control apparatus 1105 controls the semiconductor apparatus 1103. The control apparatus 1105 is, for example, a semiconductor apparatus such as a Field Programmable Gate Array (FPGA) or an Application Specific Integrated Circuit (ASIC).

The processing apparatus 1106 processes a signal output from the semiconductor apparatus 1103. The processing apparatus 1106 is a semiconductor apparatus such as a Central Processing Unit (CPU) or an ASIC for forming an Analog Front End (AFE) or a Digital Front End (DFE). The display apparatus 1107 is an Electro-Luminescence (EL) display apparatus or a liquid crystal display apparatus that displays information (image) obtained by the semiconductor apparatus 1103. The storage apparatus 1108 is a magnetic device or a semiconductor device that stores the information (image) obtained by the semiconductor apparatus 1103. The storage apparatus 1108 is a volatile memory such as a Static Random Access Memory (SRAM) or a Dynamic Random Access Memory (DRAM) or a nonvolatile memory such as a flash memory or a hard disk drive.

The mechanical apparatus 1109 includes a moving or propulsion unit such as a motor or an engine. In the equipment 1100, the mechanical apparatus 1109 displays the signal output from the semiconductor apparatus 1103 on the display apparatus 1107 and performs external transmission by a communication apparatus (not shown) of the equipment 1100. To do this, the equipment 1100 may further include the storage apparatus 1108 and the processing apparatus 1106 in addition to the memory circuits and arithmetic circuits included in the semiconductor apparatus 1103. The mechanical apparatus 1109 may be controlled based on the signal output from the semiconductor apparatus 1103.

In addition, the equipment 1100 is suitable for an electronic equipment such as an information terminal (for example, a smartphone or a wearable terminal) which has a shooting function or a camera (for example, an interchangeable lens camera, a compact camera, a video camera, or a monitoring camera). The mechanical apparatus 1109 in the camera may drive the components of the optical apparatus 1104 in order to perform zooming, an in-focus operation, and a shutter operation. Alternatively, the mechanical apparatus 1109 in the camera may move the semiconductor apparatus 1103 in order to perform an anti-vibration operation.

Furthermore, the equipment 1100 can be a transportation equipment such as a vehicle, a ship, or an airplane. The mechanical apparatus 1109 in a transportation equipment can be used as a moving apparatus. The equipment 1100 as a transportation equipment may be used as an equipment that transports the semiconductor apparatus 1103 or an equipment that uses a shooting function to assist and/or automate driving (steering). The processing apparatus 1106 for assisting and/or automating driving (steering) may perform, based on the information obtained by the semiconductor apparatus 1103, processing for operating the mechanical apparatus 1109 as a moving apparatus. Alternatively, the equipment 1100 may be a medical equipment such as an endoscope, a measurement equipment such as an analysis distance measurement sensor, an analysis equipment such as an electron microscope, or an office equipment such as a copy machine.

Figure 11B:
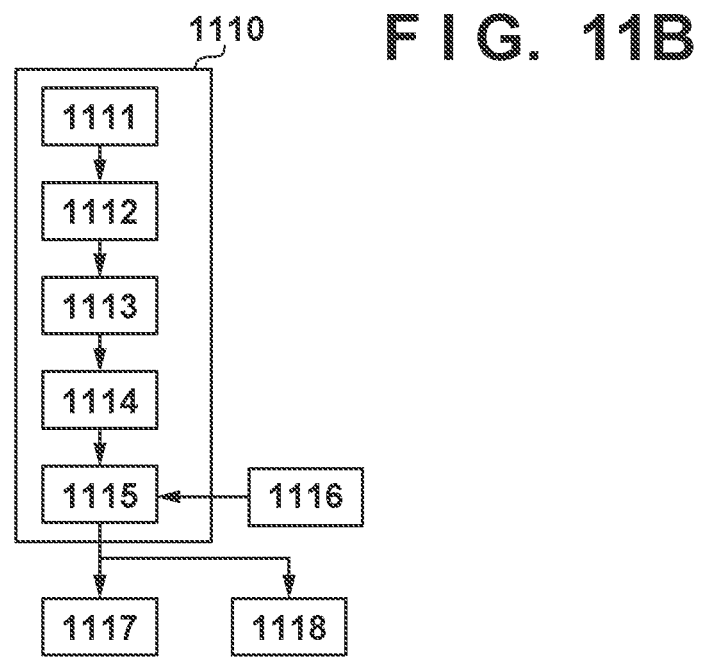
Figure 11C:
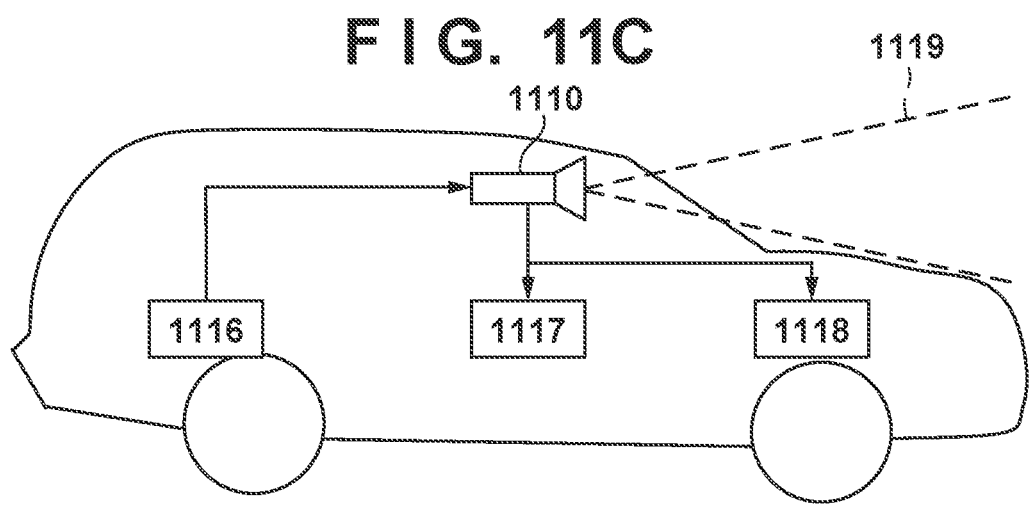

An embodiment of an image capturing system and a moving body will be described with reference to FIGS. 11B and 11C. FIG. 11B shows an example of an image capturing system 1110 concerning an in-vehicle camera. The image capturing system 1110 includes a photoelectric conversion apparatus 1111. The photoelectric conversion apparatus 1111 may be any one of the photoelectric conversion apparatuses described in the above embodiments. The image capturing system 1110 includes an image processing unit 1112 as a processing apparatus that performs image processing for a plurality of image data acquired by the photoelectric conversion apparatus 1111. The image capturing system 1110 also includes a parallax acquisition unit 1113 as a processing apparatus that calculates a parallax (the phase difference of a parallax image) from the plurality of image data acquired by the photoelectric conversion apparatus 1111. In addition, the image capturing system 1110 includes a distance acquisition unit 1114 as a processing apparatus that calculates the distance to a target object based on the calculated parallax, and a collision determination unit 1115 as a processing apparatus that determines based on the calculated distance whether there is a collision possibility. In this example, the parallax acquisition unit 1113 and the distance acquisition unit 1114 are examples of an information acquisition unit that acquires information such as distance information to a target object. That is, the distance information is information about a parallax, a defocus amount, a distance to a target object, or the like. The collision determination unit 1115 may determine the collision possibility using one of these pieces of distance information. Each of the above-described various kinds of processing apparatuses may be implemented by specially designed hardware or by general-purpose hardware for performing arithmetic processing based on a software module. Alternatively, each processing apparatus may be implemented by an FPGA, an ASIC, or the like or by a combination thereof.

The image capturing system 1110 is connected to a vehicle information acquisition apparatus 1116, and can acquire vehicle information such as a vehicle speed, a yaw rate, and a steering angle. The image capturing system 1110 is connected to a control ECU 1117 as a control apparatus that outputs a control signal to generate a braking force to the vehicle based on the determination result of the collision determination unit 1115. That is, the control ECU 1117 is an example of a moving body control unit that controls a moving body based on distance information. The image capturing system 1110 is also connected to an alarm device 1118 that generates an alarm to the driver based on the determination result of the collision determination unit 1115. For example, if the collision possibility is high as the determination result of the collision determination unit 1115, the control ECU 1117 performs vehicle control to avoid a collision or reduce damage by, for example, applying the brake, returning the accelerator, or suppressing the engine output. The alarm device 1118 warns the user by, for example, generating an alarm sound or the like, displaying alarm information on the screen of a car navigation system or the like, or giving a vibration to a seat belt or steering wheel.

In this embodiment, the image capturing system 1110 captures the periphery, for example, the front or rear of the vehicle. FIG. 11C shows the image capturing system 1110 in a case in which the front of the vehicle (image capturing range 1119) is captured. The vehicle information acquisition apparatus 1116 sends an instruction to operate the image capturing system 1110 and execute image capturing.

An example in which control is performed not to cause a collision against another vehicle has been described above. However, the image capturing system can also be applied to control for automated driving following another vehicle or automated driving without deviation from a lane. Furthermore, the image capturing system can be applied not only to a vehicle such as an automobile but also to, for example, a moving body (transportation equipment) such as a ship, an airplane, or an industrial robot. The moving apparatus in the moving body (transportation equipment) includes various kinds of moving units such as an engine, motor, wheels, and propellers.

In addition, the image capturing system can also be applied not only to the moving body but also to an equipment that widely uses object recognition, such as Intelligent Transport Systems (ITS).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-185152, filed Nov. 12, 2021, which is hereby incorporated by reference herein in its entirety.

What is claimed is:

1. A photoelectric conversion apparatus comprising:
   a plurality of pixel circuits arranged to form a plurality of pixel rows and a plurality of pixel columns;
   a plurality of signal lines configured to read out signals from the plurality of pixel circuits;
   a plurality of current sources configured to supply currents to the plurality of signal lines;
   a switching circuit configured to switch a connection state among the plurality of signal lines and the plurality of current sources; and
   a control circuit configured to control the connection state of the switching circuit,
   wherein the plurality of signal lines include a first signal line configured to read out a signal from a first pixel circuit of the plurality of pixel circuits and a second signal line configured to read out a signal from a second pixel circuit included in the same pixel column as that of the first pixel circuit,
   the plurality of current sources include a first current source and a second current source,
   the switching circuit can implement
      a first connection state in which the first signal line and the second signal line are insulated from each other, the first current source is electrically connected to the first signal line, and the second current source is electrically connected to the second signal line, and
      a second connection state in which at least the first current source is electrically connected to at least the second signal line, and
   the control circuit selects the first connection state and reads out a signal from the first pixel circuit and a signal from the second pixel circuit in parallel in a first operation mode, and selects the second connection state and reads out a signal from the first pixel circuit and a signal from the second pixel circuit separately in a second operation mode.

2. The apparatus according to claim 1, wherein in the second connection state, the first current source is further electrically connected to the first signal line.

3. The apparatus according to claim 2, wherein in the second connection state, the second current source is insulated from the first signal line and the second signal line.

4. The apparatus according to claim 2, wherein in the second connection state, the second current source is electrically connected to the first signal line and the second signal line.

5. The apparatus according to claim 1, wherein
   the switching circuit can further implement a third connection state in which the first current source is electrically connected to the first signal line, and
   in the second operation mode, the control circuit alternately selects the second connection state and the third connection state.

6. The apparatus according to claim 5, wherein
   in the second connection state, the first signal line is insulated from the first current source and the second current source, and
   in the third connection state, the second signal line is insulated from the first current source and the second current source.

7. The apparatus according to claim 6, wherein
   in the second connection state, the second current source is electrically connected to the second signal line, and
   in the third connection state, the second current source is electrically connected to the first signal line.

8. The apparatus according to claim 6, wherein
   in the second connection state, the second current source is insulated from the second signal line, and
   in the third connection state, the second current source is insulated from the first signal line.

9. The apparatus according to claim 6, further comprising:
   a first stabilization circuit configured to stabilize a potential of the first signal line; and
   a second stabilization circuit configured to stabilize a potential of the second signal line,
   wherein the control circuit operates the first stabilization circuit and does not operate the second stabilization circuit in a case where the control circuit selects the second connection state, and
   the control circuit operates the second stabilization circuit and does not operate the first stabilization circuit in a case where the control circuit selects the third connection state.

10. The apparatus according to claim 1, further comprising:
    a first transistor on a path between the first current source and the switching circuit;
    a second transistor on a path between the second current source and the switching circuit;
    a first sample-and-hold circuit configured to hold a voltage to be supplied to the first current source; and
    a second sample-and-hold circuit configured to hold a voltage to be supplied to the second current source.

11. The apparatus according to claim 1, wherein the switching circuit includes a first switch element on a path between a first node on a path between the first signal line and the first current source and a second node on a path between the second signal line and the second current source.

12. The apparatus according to claim 11, wherein the switching circuit satisfies at least one of
- a condition that a second switch element is included on a path between the second node and the second current source,
- a condition that the second switch element is included on the path between the second node and the second current source and a third switch element is included on a path between the first node and the first signal line, or
- a condition that the third switch element is included on the path between the first node and the first signal line and a fourth switch element is included on a path between the second node and the second signal line.

13. An equipment comprising:
- a photoelectric conversion apparatus defined in claim 1; and
- at least one of
    - an optical apparatus corresponding to the photoelectric conversion apparatus,
    - a control apparatus configured to control the photoelectric conversion apparatus,
    - a processing apparatus configured to process a signal output from the photoelectric conversion apparatus,
    - a display apparatus configured to display information obtained by the photoelectric conversion apparatus,
    - a storage apparatus configured to store the information obtained by the photoelectric conversion apparatus, or
    - a mechanical apparatus configured to operate based on the information obtained by the photoelectric conversion apparatus.

* * * * *